United States Patent
Mizuguchi et al.

(10) Patent No.: US 8,873,281 B2
(45) Date of Patent: Oct. 28, 2014

(54) MEMORY ELEMENT AND MEMORY DEVICE

(71) Applicant: Sony Corporation, Tokyo (JP)

(72) Inventors: Tetsuya Mizuguchi, Kanagawa (JP); Shuichiro Yasuda, Kanagawa (JP); Satoshi Sasaki, Kanagawa (JP); Naomi Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/021,713

(22) Filed: Sep. 9, 2013

(65) Prior Publication Data

US 2014/0008600 A1    Jan. 9, 2014

Related U.S. Application Data

(63) Continuation of application No. 13/060,342, filed as application No. PCT/JP2009/065054 on Aug. 28, 2009, now Pat. No. 8,547,735.

(30) Foreign Application Priority Data

Sep. 2, 2008    (JP) .................................. 2008-224711

(51) Int. Cl.

| G11C 11/00 | (2006.01) |
|---|---|
| H01L 27/24 | (2006.01) |
| H01L 45/00 | (2006.01) |

(52) U.S. Cl.
CPC .......... *H01L 45/141* (2013.01); *H01L 27/2472* (2013.01); *H01L 45/1625* (2013.01); *H01L 27/2436* (2013.01); *H01L 45/085* (2013.01); *H01L 45/1266* (2013.01); *H01L 45/145* (2013.01); *H01L 45/1233* (2013.01)
USPC ......................................... 365/163; 365/148

(58) Field of Classification Search
CPC .................................................... G11C 11/00
USPC ............. 365/46, 94, 100, 113, 129, 148, 158, 365/163; 257/2–5, 9, 296, 310, E21.35, 257/E31.047, E27.006; 438/29, 95, 96, 438/166, 135, 240, 259, 365, 482, 486, 597, 438/785; 977/754
See application file for complete search history.

(56) References Cited

U.S. PATENT DOCUMENTS 7,463,512 B2 * 12/2008 Lung .............................. 365/163
8,295,074 B2 * 10/2012 Yasuda et al. ................. 365/148

(Continued)

FOREIGN PATENT DOCUMENTS

| JP | 2002536840 | 10/2002 |
|---|---|---|
| JP | 2004342843 | 2/2004 |

(Continued)

OTHER PUBLICATIONS

Japanese Office Action issued Jul. 17, 2013 for corresponding Japanese Appln. No. 2008-224711.

(Continued)

*Primary Examiner* — Harry W Byrne
(74) *Attorney, Agent, or Firm* — K&L Gates LLP (57) ABSTRACT

A memory element capable of simultaneously satisfying the number of repeating operation times and a low-voltage operation characteristic which are in a tradeoff relation is provided. The memory element has a high-resistivity layer and an ion source layer between a bottom electrode and a top electrode. The high-resistivity layer is made of an oxide containing Te. Any of elements other than Te such as Al, Zr, Ta, Hf, Si, Ge, Ni, Co, Cu, and Au may be added. In the case of adding Al to Te and also adding Cu and Zr, the composition ratio of the high-resistivity layer is preferably adjusted in the ranges of 30≤Te≤100 atomic %, 0≤Al≤70 atomic %, and 0≤Cu+Zr≤36 atomic % except for oxygen. The ion source layer is made of at least one kind of metal elements and at least one kind of chalcogen elements of Te, S, and Se.

16 Claims, 6 Drawing Sheets

(56) References Cited

U.S. PATENT DOCUMENTS

| | | | |
|---|---|---|---|
| 2005/0226036 A1 | 10/2005 | Aratani et al. | |
| 2007/0195590 A1* | 8/2007 | Sugita | 365/163 |
| 2008/0083918 A1 | 4/2008 | Aratani et al. | |
| 2008/0192534 A1* | 8/2008 | Lung | 365/163 |
| 2010/0259967 A1* | 10/2010 | Yasuda et al. | 365/148 |

FOREIGN PATENT DOCUMENTS

| | | |
|---|---|---|
| JP | 2005-197634 | 7/2005 |
| JP | 2005197634 | 7/2005 |
| JP | 2006-040946 | 2/2006 |
| JP | 2006040946 | 9/2006 |
| JP | 2009-146480 | 7/2009 |
| JP | 2009146480 | 7/2009 |
| WO | 00/48196 | 8/2000 |

OTHER PUBLICATIONS

International Search Report dated Oct. 27, 2009 for corresponding International Appl. No. PCT/JP2009/065054.

Reproducible switching effect in thin oxide films for memory applications, Applied Physics Letter, vol. 77, No. 1 dated Jul. 3, 2000., p. 139-141.

PMC suitable for multilayering of cells, Nekkei Electronics dated Jan. 20, 2000, p. 104.

* cited by examiner

MEMORY ELEMENT AND MEMORY DEVICE

CROSS REFERENCE TO RELATED APPLICATIONS

The present application is a Continuation of U.S. application Ser. No. 13/060,342, filed on Feb. 23, 2011, which is a National Stage of International Application No. PCT/JP2009/065054 filed on Aug. 28, 2009 and which claims priority to Japanese Patent Application No. 2008-224711 filed on Sep. 2, 2008, the entire contents of which are being incorporated herein by reference.

BACKGROUND

The present disclosure relates to a memory element having a high-resistance layer and an ion source layer between two electrodes, in which mainly a resistance value of the high-resistance layer is changed by voltage application and to a memory device having the In information devices such as a computer, a DRAM (Dynamic Random Access Memory) of high density and capable of operating at high speed is widely used. However, the DRAM has a problem of high manufacturing cost since the manufacturing process is complicated as compared with general circuits such as a logic circuit and a signal processing circuit used for an electronic device. Further, the DRAM is a volatile memory in which information disappears when the power source is turned off and refresh operation has to be performed frequently.

Then, as nonvolatile memories in which information does not disappear even when the power source is turned off, for example, an FeRAM (Ferroelectric Random Access Memory), an MRA (Magnetoresistive Random Access Memory), and the like are proposed. In those memories, written information is held for long time without supplying power and, since it is unnecessary to perform the refresh operation, the power consumption can be decreased only by the amount. However, in the above-mentioned nonvolatile memories, as the size of memory cells decreases, it is becoming difficult to assure the characteristics of the memories. Then, as memories adapted to miniaturization of memory cells, for example, memory elements of novel types described in patent document 1 and non-patent documents 1 and 2 are proposed.

For example, in memory elements described in the patent document 1 and the non-patent document 1 (detailed below), an ion source layer containing one kind of metal elements of Cu (copper), Ag (silver), and Zn (zinc) and one kind of chalcogen elements of S (sulfur) and Se (selenium) is provided between two electrodes. One of the electrodes contains the metal element contained in the ion source layer. In the memory element having such a configuration, when voltage is applied across the two electrodes, the above-mentioned metal element contained in the one of the electrodes is diffused as ions into the ion source layer, and the electric characteristic such as a resistance value, a capacitance value, or the like in the ion source layer changes. Consequently, by using the change in the electric characteristic, the memory function can be displayed.

Moreover, in a memory element described in the non-patent document 2, for example, a crystal oxide material layer made of $SrZrO_3$ in which Cr (chromium) is doped is provided between two electrodes. One of the electrodes is made of $SrRuO_3$ or Pt (platinum) and the other electrode is made of Au (gold) or Pt. However, the details of the operation principle of the memory element are unknown.

In the memory elements described in patent document 1 and the non-patent document 1, the characteristics of the ion source layer itself determine the quality of the memory characteristics. The memory characteristics include, for example, operation speeds (write speed and erase speed), erasure characteristics (the ratio between resistance before write/erase operation in the repeating operation is performed and resistance after the write/erase operation is performed, also called erasure resistance recovery characteristic), recording characteristics, data retention characteristics (changes in recording resistance and erasure resistance before and after a heating acceleration test), the number of repeating operation times, and power consumption at the time of recording/erasure. However, many of them have a tradeoff relation at the time of adjusting the composition ratio of one element in the ion source layer. Consequently, for example, when the composition ratio of one element in the ion source layer is adjusted for the purpose of improving write speed, there is a case that the erasure characteristic deteriorates. Like this case, there is a problem such that only by adjusting the composition ratio of one element in the ion source layer, it is not easy to improve the characteristics having a tradeoff relation at the same time. To address the problem, for example, in patent document 2, a method of improving the data retention characteristic by also providing a high-resistivity layer (oxide layer) is used.

CITATION LIST

Patent Document

Patent document 1: Japanese Unexamined Patent Application Publication (Translation of PCT Application) No. 2002-536840

Patent document 2: Japanese Unexamined Patent Application Publication No. 2004-342843

Non-Patent Document

Non-patent document 1: Nikkei Electronics, January 20 issue, 2003, (p. 104)

Non-patent document 2: A. Beck et al., Appl. Phys. Let5t., 77, (2000), p. 139

SUMMARY

To increase the number of repeating operation times by providing the high-resistivity layer, an oxide material which is not easily destroyed by operation current or the like has to be selected. However, one factor of determining the operation voltage is easiness of penetration of ions to the oxide or the like, and there is tendency that ions do not easily penetrate a solid oxide. Consequently, to satisfy both of increase in the number of repeating operation times and improvement in the low-voltage operation characteristic, selection of the oxide material is important.

A memory element of an embodiment has, between first and second electrodes, a high-resistivity layer made of an oxide containing Te (tellurium), and an ion source layer containing at least one kind of metal elements and at least one kind of chalcogen elements from Te, S, and Se. A memory device of the invention has memory elements arranged in an array or matrix.

In the memory element and the memory device of the present embodiment, by applying predetermined voltage across the first and second electrodes, the resistance value of mainly the high-resistivity layer changes and information is accordingly written/erased. Since the high-resistivity layer is made of the Te oxide, the number of repeating operation times is increased, and the low-voltage operation is enabled.

In the memory element and the memory device of the present embodiment, the ion source layer contains at least one kind of metal elements and at least one kind of chalcogen elements of Te, S, and Se, and the high-resistivity layer is made of an oxide containing Te. Consequently, the number of repeating operation times and the low-voltage operation characteristic which are in the tradeoff relation can be simultaneously improved.

Additional features and advantages are described herein, and will be apparent from, the following Detailed Description and the figures.

DETAILED DESCRIPTION

An embodiment will be described in detail below with reference to the drawings.

Figure 1:
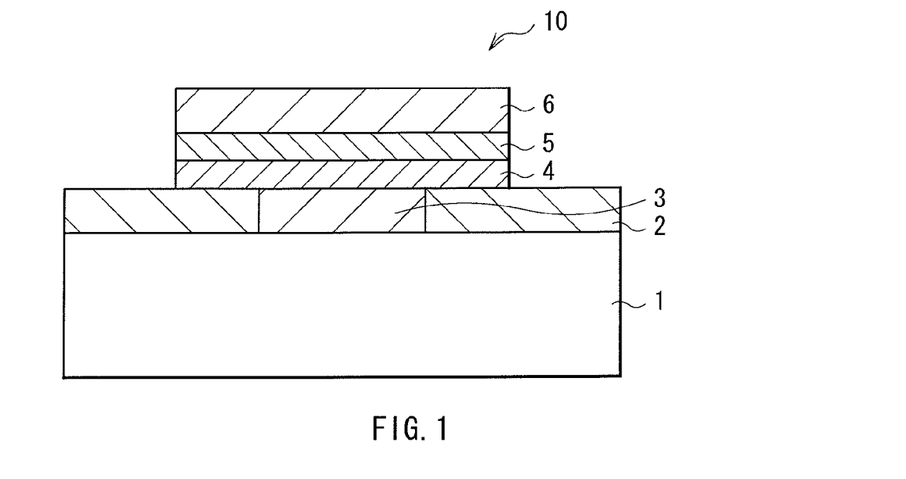
FIG. 1 is a cross section illustrating the configuration of a memory element according to an embodiment.

FIG. 1 shows a sectional configuration of a memory element according to an embodiment. A memory element 10 has a high-resistivity layer 4 and an ion source layer 5 between a bottom electrode 3 and a top electrode 6. The bottom electrode 3 is provided, for example, on a silicon substrate 1 in which a CMOS (Complementary Metal Oxide Semiconductor) circuit s formed as will be described later (FIG. 3) and serves as a connection part to the CMOS circuit part.

The memory element 10 is obtained by stacking, on the silicon substrate 1, the bottom electrode 3, the high-resistivity layer 4, the ion source layer 5, and the top electrode 6 in this order. The bottom electrode 3 is buried in an opening in an insulating layer 2 formed on the silicon substrate 1. The high-resistivity layer 4, the ion source layer 5, and the top electrode 6 are formed in the same plane pattern. The bottom electrode 3 is narrower than the high-resistivity layer 4 and is electrically connected to a part of the high-resistivity layer 4.

Figure 2:
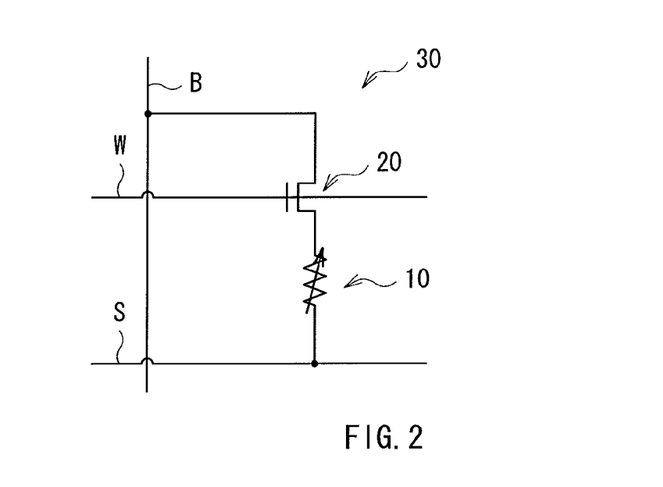
FIG. 2 is a circuit configuration diagram of a memory cell using the memory element of FIG. 1.

FIG. 2 shows a memory cell 30 constructed by the memory element 10 and a transistor 20 (switching element). The bottom electrode 3 of the memory element 10 is electrically connected to a source line S, and the top electrode 6 is electrically connected to the drain of the transistor 20. The source of the transistor 20 is electrically connected to a bit line B, and the gate of the transistor 20 is electrically connected to a word line W.

For the bottom electrode 3 and the top electrode 6, a wiring material used for semiconductor process, such as TiW, Ti, W, Cu, Al, Mo, Ta, WN, TaN, silicide, or the like is used. The insulating layer 2 is made of, for example, a hard-cured photoresist, $SiO_2$ or $Si_3N_4$ generally used for a semiconductor device, or another material such as an inorganic material such as SiON, SiOF, $Al_2O_3$, $Ta_2O_5$, $HfO_2$, or $ZrO_2$, a fluorine organic material, an aromatic organic material, or the like.

The high-resistivity layer 4 is made of an oxide containing Te since information is recorded by changing the resistance value of the high-resistivity layer 4 by voltage application as will be described later. The melting point of Te is 449.57° C. and that of $TeO_2$ as an oxide is 733° C. which are moderately low. By making the high-resistivity layer 4 contain Te or Te oxide, the number of repeating operation times is increased, and low-voltage operation is made possible.

Preferably, the Te oxide contains an element other than Te, for example, Al. By using Al as an insulator, a stable oxide such as $Al_2O_3$ is formed. For example, the melting point of $Al_2O_3$ is 2046.5° C. and higher than that of Te or $TeO_2$. By making a low-melting-point material mixedly exist in a stable structure made of the high-melting-point material, a low-voltage operation is made possible, and the number of repeating operation times is increased.

To the high-resistivity layer 4, other than the above, Zr (zirconium), Ta (tantalum), Hf (hafnium), Si (silicon), Ge (germanium), Ni (nickel), Co (cobalt), Cu, or Au may be added. By the addition, the impedance of the oxide is controlled. Concretely, in the case of adding Al to Te and, further, adding Cu and Zr, it is preferable to adjust the composition ratio of the high-resistivity layer 4 in the ranges of $30 \leq Te \leq 100$ atomic %, $0 \leq Al \leq 70$ atomic %, and $0 \leq Cu+Zr \leq 35$ atomic %. By the adjustment, as will be described later, for example, recording threshold voltage is set to a low voltage of 1.8V, and the number of repeating operation times is set to $1 \times 10^6$ times or larger. This is because Cu is easily oxidized and easily reduced (low resistivity), and on the other hand, Zr is easily oxidized but is not easily reduced (high resistivity). Consequently, by adjusting the amount of Cu and Zr, the resistance value of the high-resistivity layer is controlled. Therefore, from the viewpoint of the resistance value control, another material may be used as long as it works in a manner similar to the above. In addition, the composition ratio in the embodiment expresses the relations of Al before oxidization and other elements except for oxygen. Further, although it is presumed that the actual oxygen concentration of the high-resistivity layer 4 is oxygen concentration to a degree determined by the stoichiometric proportion, the embodiment is not limited to the case.

The ion source layer 5 contains any of metal elements such as Cu, Ag, and Zn and also contains at least one kind of chalcogenide elements of Te, Se, and S. Concretely, CuTe, GeSbTe, CuGeTe, AgGeTe, AgTe, ZnTe, ZnGeTe, CuS, CuGeS, CuSe, and CuGeSe, in addition, ZrTe, ZrTeSi, ZrTeGeSi, ZrTeAlSi, ZrTeAl, and the like may be also used. Further, B (boron), a rare-earth element, or Si may be contained.

In the embodiment, particularly, the part in which the resistance value changes is limited to the high-resistivity layer 4 having a relatively high resistance value, and it is preferable to use Te as the chalcogenide element of the ion source layer 5 from the viewpoint of using a material whose resistivity is sufficiently lower than that of the high-resistivity layer 4 (for example, lower than the resistance value of the high-resistivity layer 4 which is in the on state). It is preferable to make the ion source layer 5 contain at least one of Cu, Ag, and Zn which easily move as cations such as CuTe, AgTe, or ZnTe. In particular, when the ion source layer 5 contains CuTe, the resistivity of the ion source layer 5 becomes lower, and a resistance change in the ion source layer 5 is made sufficiently smaller than that in the high-resistivity layer 4. Therefore, stability in memory operation improves.

Next, the operation of the memory element 10 will be described.

(Writing)

When positive potential (+ potential) is applied to the top electrode 6 and negative potential (− potential) or zero potential is applied to the bottom electrode 3, the metal element of at least one kind of Cu, Ag, and Zn is ionized from the ion source layer 5, diffused in the high-resistivity layer 4, coupled to electrons on the bottom electrode 3 side, and deposited or remains in a state where it is diffused in the high-resistivity layer 4. As a result, a current path containing a large amount of the metal element of at least one kind of Cu, Ag, and Zn is formed in the high-resistivity layer 4, or a number of defects by the metal element of at least one kind of Cu, Ag, and Zn are formed in the high-resistivity layer 4, and the resistance value of the high-resistivity layer 4 becomes low. At this time, since the resistance value of the ion source layer 5 is originally lower than that of the high-resistivity layer 4 before recording, the resistance value of the entire memory element 10 also becomes lower. At this time, the resistance in the entire memory element 10 becomes write resistance.

After that, when the application potential to the top electrode 6 and the bottom electrode 3 is set to zero, the low resistance state of the memory element 10 is held. In such a manner, information is written.

(Erasure)

Next, when the negative potential (− potential) is applied to the top electrode 6 and the positive potential (+ potential) or zero potential is applied to the bottom electrode 3, the metal element of at least one kind of Cu, Ag, and Zn constructing the current path formed in the high-resistivity layer 4 or impurity level is ionized, moved in the high-resistivity layer 4, and returns to the ion source layer 5 side. As a result, the current path or a defect disappears from the high-resistivity layer 4, and the resistance value of the high-resistivity layer 4 increases. At this time, since the resistance value of the ion source layer 5 is originally low, when the resistance value of the high-resistivity layer 4 becomes higher, the resistance value of the entire memory element 10 becomes also higher. The resistance of the entire memory element 10 at this instance becomes erasure resistance.

After that, when the application potential to the top electrode 6 and the bottom electrode 3 is set to zero, a high resistance state of the memory element 10 is held. In such a manner, recorded information is erased. By repeatedly performing such a process, recording (writing) of information on the memory element 10 and erasure of the recorded information can be repeatedly performed.

For example, at this time, when a state where the resistance of the entire memory element 10 is write resistance (high resistance state) is made correspond to information of "1" and a state where the resistance of the entire memory element 10 is erasure resistance (low resistance state) is made correspond to information of "0", by applying the positive potential (+ potential) to the top electrode 6, the information of the memory element 10 is changed from "0" to "1". By applying the negative potential (− potential) to the top electrode 6, the information of the memory element 10 is changed from "1" to "0".

In the embodiment, information is recorded and erased by using the memory element 10 having a simple structure of just stacking the bottom electrode 3, the high-resistivity layer 4, the ion source layer 5, and the top electrode 6 in this order. Even when the memory element 10 is miniaturized, recording and erasure of information can be performed easily. In addition, even no power is supplied, the resistance value of the high-resistivity layer 4 is held, so that information is stored for long time. Since the resistance value of the high-resistivity layer 4 is not changed by reading and it is unnecessary to perform refresh operation, the power consumption is reduced only by the amount. Further, as the retention characteristic improves, multivalue recording is also enabled.

Further, in the embodiment, the ion source layer 5 contains, in addition to the metal element of Cu, Ag, or Zn, at least one kind of chalcogen elements of Te, S, and Se. By containing the chalcogen element, the metal element (Cu, Ag, Zn, or the like) and the chalcogen element (Te, S, or Se) in the ion source layer 5 are coupled to form a metal chalcogenide layer. The metal chalcogenide layer has mainly a noncrystalline structure. For example, when the positive potential is applied to the top electrode 6 side which is in contact with the ion source layer 5 made by the metal chalcogenide layer, the metal element of Cu, Ag, or Zn contained in the metal chalcogenide layer is ionized, diffused in the high-resistivity layer 4 displaying high resistivity, coupled to electrons in a part on the bottom electrode 3 side, and deposited, or remains in the high-resistivity layer 4 to form an impurity level of the insulating film. Thereby, the resistivity of the high-resistivity layer 4 decreases, and information is easily recorded.

Further, in the embodiment, the high-resistivity layer 4 is made of oxide containing Te. Therefore, the number of repeating operation times increases and, simultaneously, low-voltage operation is made possible. Examples will be described later.

Next, a process of manufacturing the memory element 10 of the embodiment will be described.

First, on the silicon substrate 1 having low resistivity, the insulating layer 2 (made of, for example, $Al_2O_3$, $Ta_2O_5$, or the like) is uniformly deposited by sputtering and, further, a pattern for forming the bottom electrode is formed in the insulating layer 2 by photolithography. After that, the insulating layer 2 is selectively removed by RIE (Reactive Ion Etching) to form an opening. Subsequently, W or the like is deposited in the opening by sputtering to form the bottom electrode 3. After that, the surface is treated by CMP (Chemical Mechanical Polishing), etch back, or the like so as to be planarized.

Next, on the insulating layer 2 and the bottom electrode 3, the high-resistivity layer 4 is formed by sputtering. Methods of forming the high-resistivity layer 4 include a method of depositing a constituent element while passing an oxygen gas by reactive sputtering, a method of performing deposition of constituent elements simultaneously by using a plurality of targets without passing the oxygen gas by deposition mixture or performing deposition of constituent elements separately by layer-stacking mixture and then executing plasma oxidation, a method of forming an oxide layer by using a target obtained by mixing oxygen and another constituent element in advance, and a method of stacking constituent elements. Subsequently, layers of the ion source layer 5 and the top electrode 6 are continuously formed. After that, by patterning the high-resistivity layer 4, the ion source layer 5, and the top electrode 6 by photolithography and etching process, the memory element 10 is completed.

In the embodiment, each of the bottom electrode 3, the high-resistivity layer 4, the ion source layer 5, and the top electrode 6 is made of a material which can be sputtered. For example, it is sufficient to perform sputtering using a target whose composition is adapted to the materials of the layers. By changing targets in the same sputtering apparatus, film deposition is continuously performed.

In the embodiment, particularly, in the case of realizing the high-resistivity layer 4, not by a combination of a single element and oxygen, but in the form of adding a plurality of elements, the metal elements and oxide may be mixed and deposited, for example, simultaneously. The high-resistivity layer 4 may be formed by depositing both a metal element and a metal element forming an oxide and, after that, oxidizing the elements by using plasma oxidation or the like.

Further, the composition of the high-resistivity layer 4 is adjustable by a method of simultaneously depositing a metal oxide or a metal and a noble metal element using an apparatus capable of depositing a plurality of materials at the same time, or a method of repeatedly stacking a layer by setting film deposition time in which each of the materials does not form a layer. By adjusting the film deposition rate of each of materials by the method of repeatedly stacking a layer, the composition of the oxide layer of the high-resistivity layer 4 is changeable.

By disposing a number of the memory elements 10 in, for example, an array or a matrix, a memory device (memory) is constructed. In this case, it is sufficient to connect a MOS transistor for device selection or a diode to each of the memory elements 10 as necessary to construct a memory cell and, further, connect the memory cell to a sense amplifier, an address decoder, a write/erase/read circuit, or the like via a wiring.

Concretely, for example, the bottom electrode 3 is formed commonly for memory cells in the row direction, a wiring connected to the top electrode 6 is formed commonly for memory cells in the column direction, and the bottom electrode 3 in which current is passed by voltage application and the wiring are selected, thereby selecting a memory cell to which information is to be recorded. By passing current to the memory element 10 of the memory cell, information can be written or written information can be erased.

Figure 3:
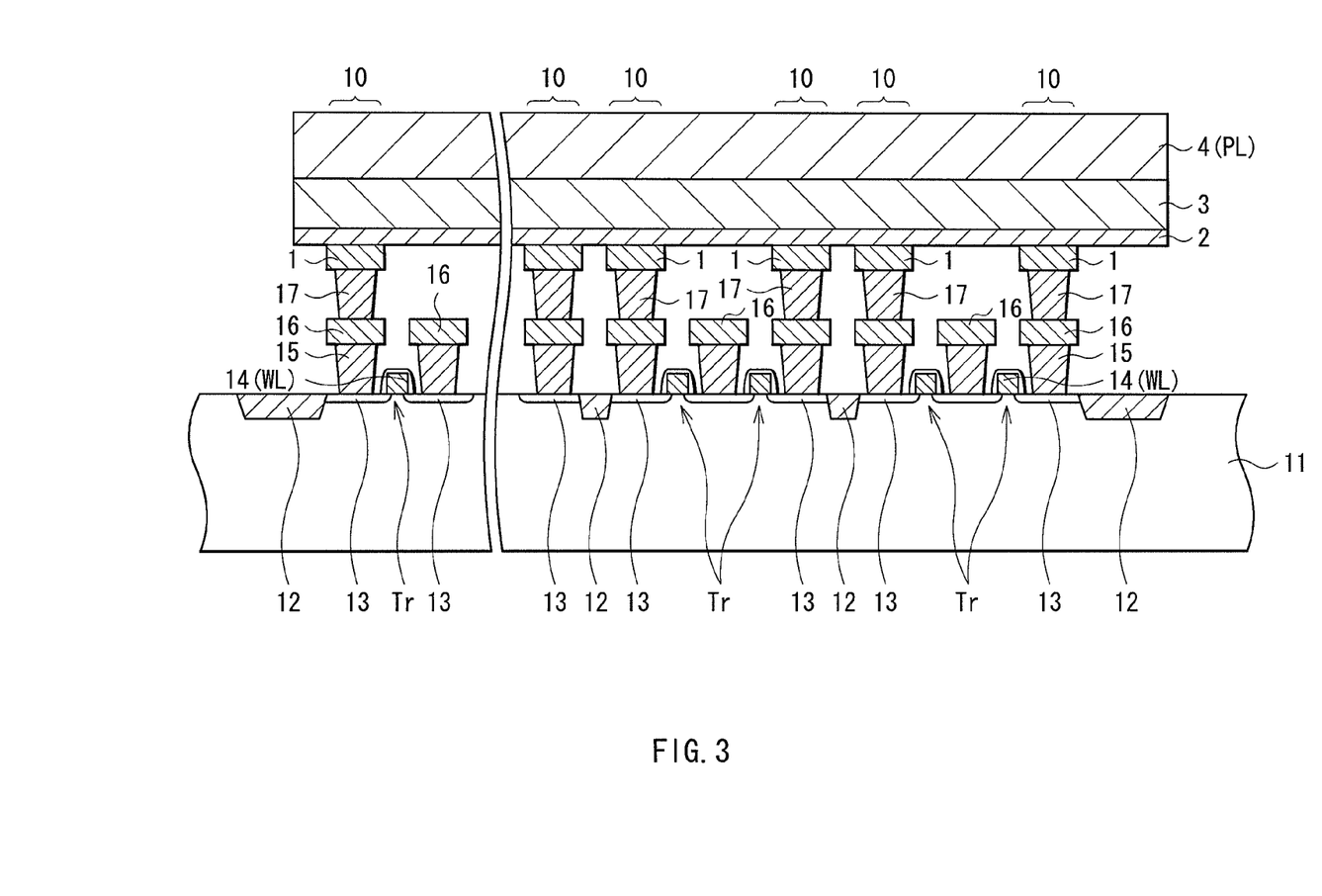
FIG. 3 is a cross section showing a schematic configuration of a memory cell array using the memory element of FIG. 1.
Figure 4:
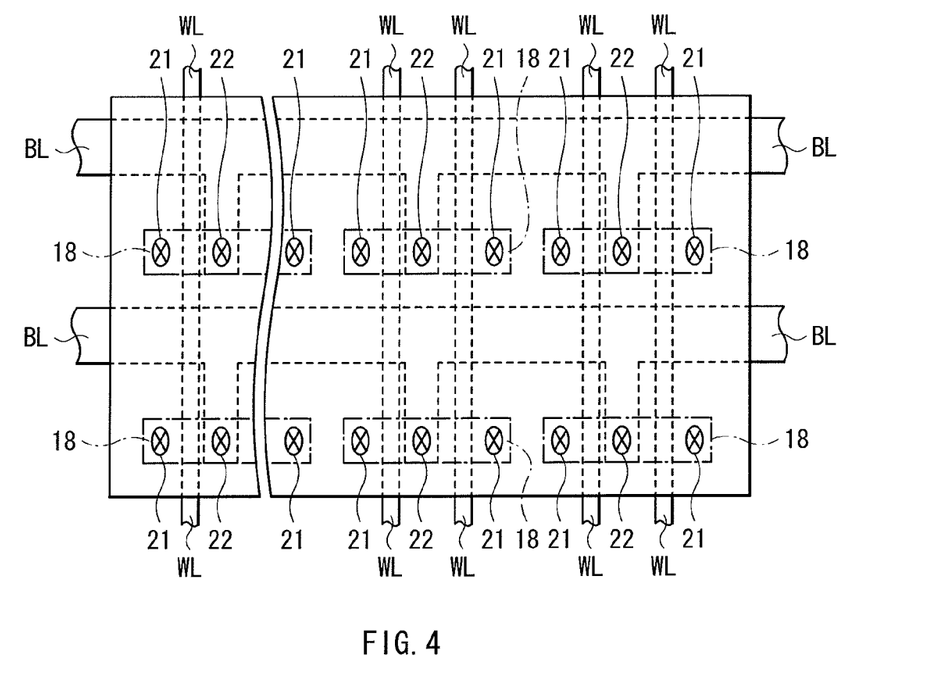
FIG. 4 is a plan view of the memory cell array.

FIGS. 3 and 4 show an example of a memory device (memory cell array) 100 in which a number of memory elements 10 are disposed in a matrix. FIG. 3 shows a sectional configuration, and FIG. 4 shows a configuration in plan view. In the memory cell array, for each of the memory elements 10, a wiring connected to the bottom electrode 3 side and a wiring connected to the top electrode 6 side are provided so as to cross each other. For example, each memory element 10 is disposed around the intersecting point of the wirings. Further, for example, the wiring connected to the top electrode 6 side is formed commonly for the entire array.

More concretely, each memory element 10 has the high-resistivity layer 4, the ion source layer 5, and the top electrode 6. That is, each of the high-resistivity layer 4, the ion source layer 5, and the top electrode 6 is constructed by a layer common to the memory element 10 (the same layer). The top electrode 6 formed commonly serves as a plate electrode PL. On the other hand, the bottom electrode 3 is formed individually for each memory cell, so that the memory cells are electrically isolated from one another. By the bottom electrode 3 for each memory cell, the memory element 10 of each memory cell is specified in a position corresponding to each bottom electrode 3. The bottom electrode 3 is connected to a MOS transistor Tr for selecting a corresponding cell, and each memory element 10 is formed above the MOS transistor Tr. The MOS transistor Tr is constructed by a source/drain region 13 and a gate electrode 14 formed in regions isolated by a device isolation layer 12 in a semiconductor substrate 11. On the wall face of the gate electrode 14, a sidewall insulating layer is formed. The gate electrode 14 also serves as a word line WL as one of address wirings of the memory element 10. One of the source/drain regions 13 of the MOS transistor Tr and the bottom electrode 3 of the memory element 10 are electrically connected via a plug layer 15, a metal wiring layer 16, and a plug layer 17. The other source/drain region 13 of the MOS transistor Tr is connected to the metal wiring layer 16 via the plug layer 15. The metal wiring layer 16 is connected to a bit line BL (refer to FIG. 3) as the other address wiring of the memory element. In addition, in FIG. 3, an active region 18 of the MOS transistor Tr is shown by a chain line, a contact part 21 is connected to the bottom electrode 3 of the memory element 10, and a contact part 22 is connected to a bit line BL, respectively.

In the memory cell array, when the gate of the MOS transistor Tr is set to an on state by the word line WL and voltage is applied to the bit line BL, the voltage is applied to the bottom electrode 3 of the selected memory cell via the source/drain 13 of the MOS transistor Tr. Here, in the case where the polarity of the voltage applied to the bottom electrode 3 is a negative potential as compared with the potential of the top electrode 6 (plate electrode PL), the resistance value of the memory element 10 shifts to the low resistance state as described above. In such a manner, information is written to the selected memory cell. Next, when the voltage of the positive potential as compared with the potential of the top electrode 6 (plate electrode PL) is applied to the bottom electrode 3, the resistance value of the memory element 10 shifts again to a high resistance state. By the shift, information written in the selected memory cell is erased. To read written information, for example, a memory cell is selected by the MOS transistor Tr and predetermined voltage or current is applied to the cell. The current or voltage which varies according to the resistance state of the memory element 10 at this time is detected via a sense amplifier or the like connected to the tip of the bit line BL or the plate electrode PL. In addition, the voltage or current applied to the selected memory cell is set to be smaller than a threshold of the voltage or the like at which the state of the resistance value of the memory element 10 shifts.

In the case of constructing the memory device 100 by using the memory elements 10, the size of the transistor for driving may be small, so that integration (higher density) and miniaturization can be realized. And, such a memory device 100 is applicable to various memory apparatuses as described above. It is applicable to any memory form such as, for example, a so-called PROM (Programmable Read Only Memory) to which information can be written only once, an EEPROM (Erasable Programmable Read Only Memory) in which data can be electrically erased, or a so-called RAM in which writing, erasing, and reproduction can be performed at high speed.

EXAMPLES

Next, examples showing the effect of the high-resistivity layer 4 will be described.

By the above-described manufacturing method, the insulating layer 2 made of silicon oxide ($SiO_2$) was deposited on the silicon substrate 1. Further, an opening of a circular pattern of 0.3 µmφ was formed in the insulating layer 2. After that, the opening was buried with W (tungsten), thereby forming the bottom electrode 3 having a thickness of 20 nm. Next, an oxide film containing Te was formed as the high-resistivity layer 4 on the insulating layer 2 and the bottom electrode 3. The high-resistivity layer 4 was formed by depositing a Te layer by sputtering on the insulating layer 2 and the bottom electrode 3 and, after that, executing plasma oxidation from the surface for one minute. As parameters, the partial pressure of Ar was set to 0.26 Pa, the partial pressure of $O_2$ was set to 0.05 Pa, and power was set to 30 W. In addition, by adding Cu, Zr, and Al except for Te, and samples of different composition ratios were manufactured. The layer thickness before the plasma oxidation of the samples was set to be constant (1.2 nm). Subsequently, $Cu_{30}Te_{40}Al_{40}Zr_{10}$ was formed with a thickness of 20 nm as the ion source layer 5 and, further, a W film with a thickness of 200 nm was formed as the top electrode 6. After that, by the photolithography technique, each of the high-resistivity layer 4, the ion source layer 5, and the top electrode 6 deposited on the insulting layer 2 and the bottom electrode 3 was patterned by using a plasma etching apparatus, thereby forming a plurality of memory elements 10 having different compositions of the high-resistivity layer 4 with the structure shown in FIG. 1 and using them as samples.

Experiment 1

Figure 5:
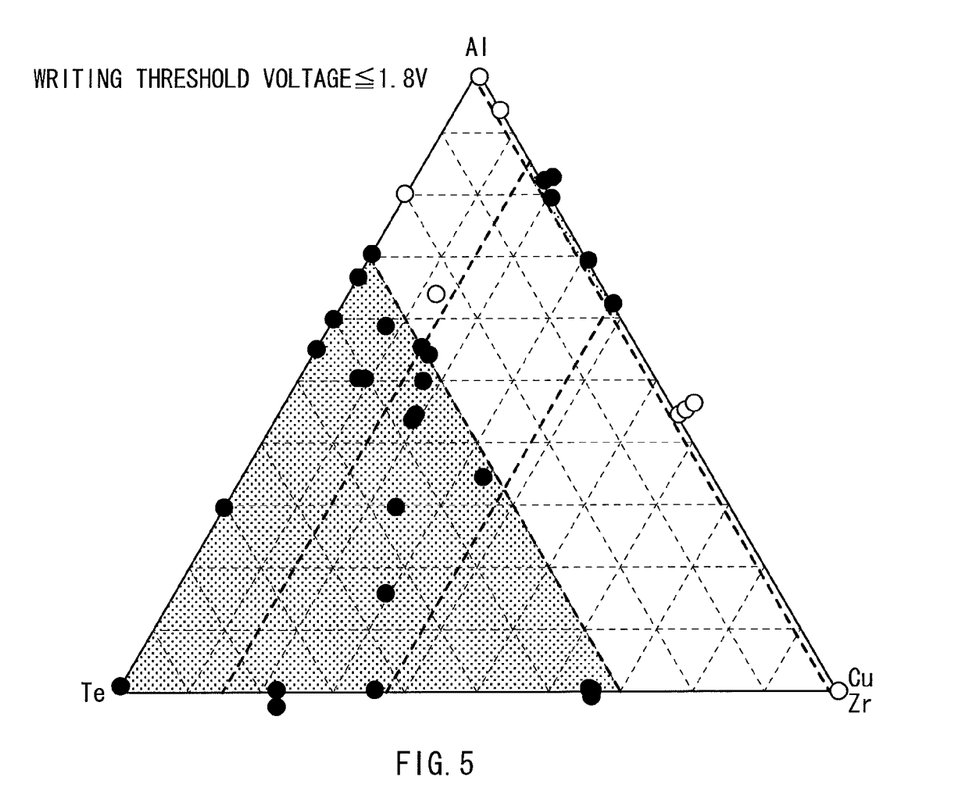
FIG. 5 is a diagram for explaining a low-voltage operation characteristic (experimental example 1).

Writable voltages at room temperature of the plurality of memory elements 10 having different compositions of the high-resistivity layer 4 were examined. The result is shown in FIG. 5. In addition, although there are a number of power source voltages of memories used generally, 1.8 V was used here as an example. Whether a low-voltage operation is possible or not was determined by whether writing operation can be performed with the voltage or not. It was determined that the writing can be performed when the resistance value became 20 kΩ or less after the writing operation. In FIG. 5, the case where writing operation can be performed with a voltage of 1.8 V or less when current voltage is applied in the writing direction polarity is shown as a solid dot, the case where the recording is impossible is shown as a blank dot, and the constituent materials of the high-resistivity layer 4 were plotted in three dimensions (Te, Al, and Cu+Zr). Herein, the ratio of each of the elements excluding oxygen is shown.

It is understood from FIG. 5 that in the memory element 10, the writing operation at a low voltage (1.8 V or less) is possible in a region where Te contained in the high-resistivity layer 4 is 30 atomic % or higher and a part of region where Te is 0%. It is considered that since the ratio of the Te oxide having a relatively low melting point increased in the high-resistivity layer 4, the operation with low voltage became possible.

Experiment 2

Figure 6:
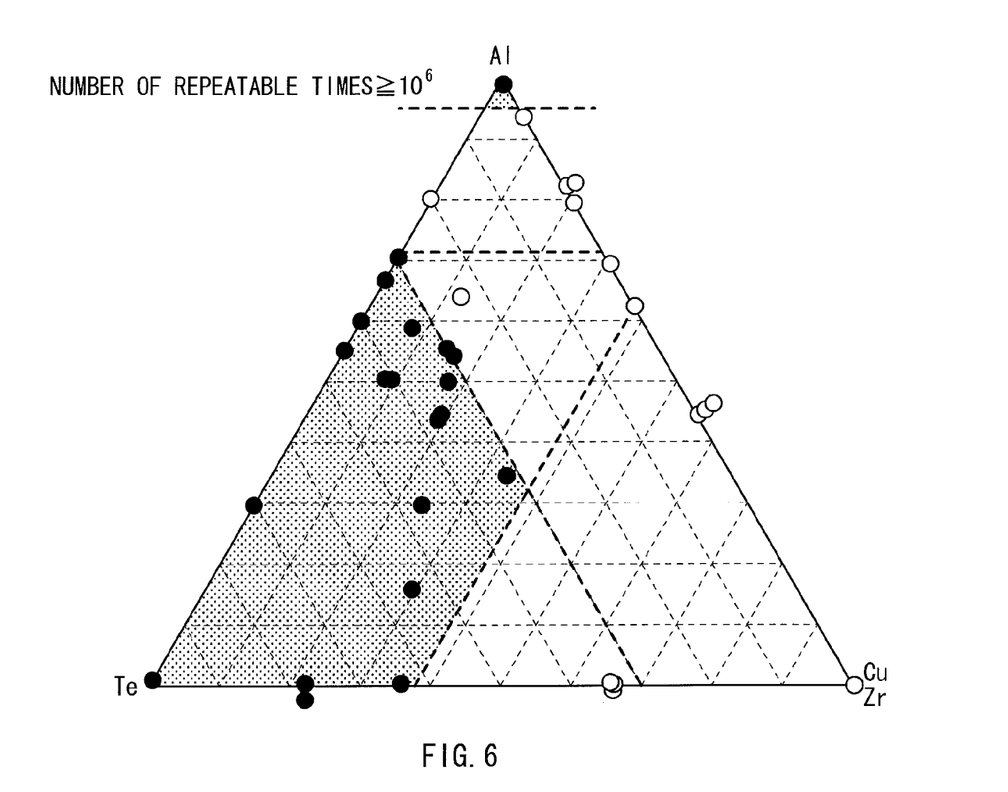
FIG. 6 is a diagram for explaining the number of repeating operation times (experimental example 2).

FIG. 6 shows a result of performing an experiment of performing write/erasure repeating operation on the above-described plurality of memory elements 10 having different compositions of the high-resistivity layer 4. As operating conditions, write pulse width was set to 25 nsec, erasure pulse width was set to 1 nsec, write voltage was set to 2.2V, current at the time of writing was set to 120 μA, erasure voltage was set to 1.6V, and current at the time of erasure was set to 70 μA. Here, as the reference of the number of write/erase repeating operation times, $10^6$ was set. The case where the number of repeating operation times of $10^6$ or larger is possible is shown as a solid dot, the case where it is impossible is shown as a blank dot, and the cases were plotted in three dimensions. In addition, in a manner similar to the experiment 1, the ratio of each of the elements excludes oxygen.

It is understood from FIG. 6 that when Te contained in the high-resistivity layer 4 is 30 atomic % or higher, Al is 70 atomic % or lower and, further, atoms other than Te and Al (in this case, Cu and Zr) are within a surrounded range of 36 atomic % or less, or when Al is 100%, the memory element 10 can perform the write/erase repeating operation by $10^6$ times or more.

Figure 7:
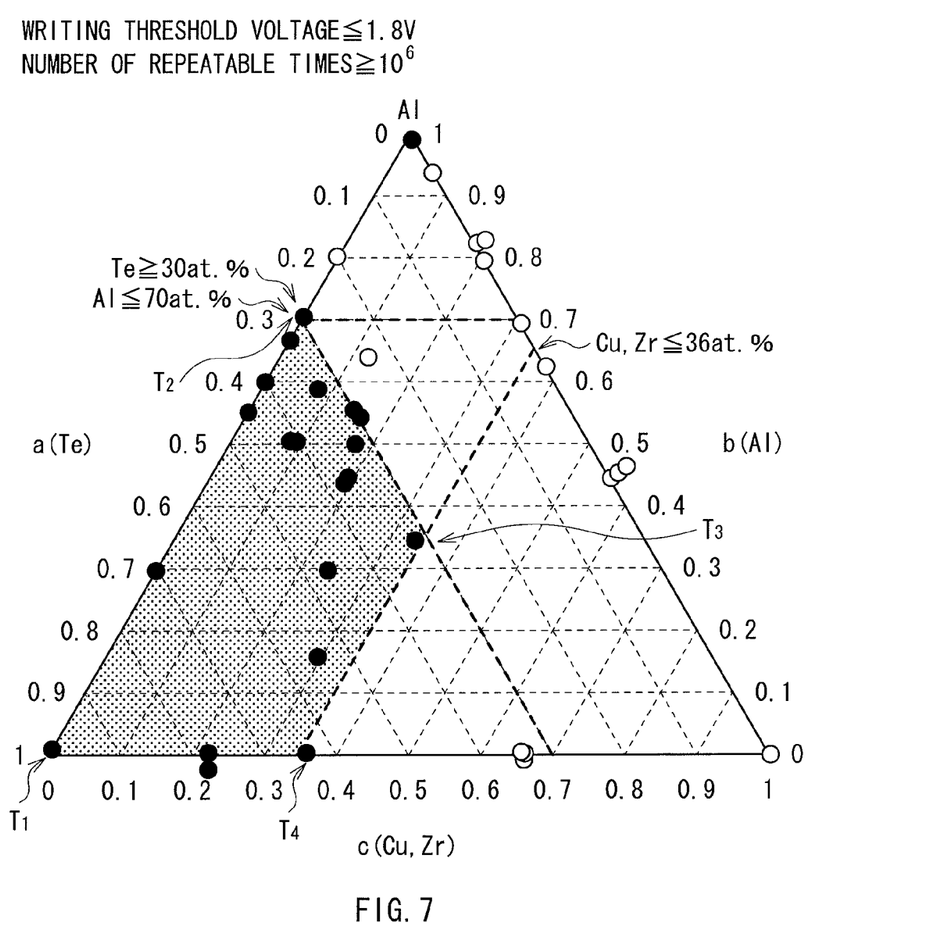
FIG. 7 is a characteristic diagram for explaining a composition range satisfying a low-voltage operation characteristic and the number of repeating operation times.

It is understood from the results of the experiments 1 and 2 that the composition of the high-resistivity layer 4 simultaneously satisfying the number of repeating operation times ($10^6$ times or more) and the low-voltage operation characteristic (1.8V or less) is that, as shown in FIG. 7 obtained by overlapping FIGS. 5 and 6, 30≤Te≤100 atomic %, Al≤70 atomic %, and Cu, Zr≤36 atomic %. In other words, the composition ratio of Te, Al, and Cu+Zr (atomic % ratio, excluding oxygen) may be a value within a range connecting the following points T1, T2, T3, and T4 when Te is expressed as "a", Al is expressed as "b", and Cu+Zr is expressed as "c".

$T1(a,b,c)=(1,0,0)$ $T2(a,b,c)=(0.3,0.7,0)$ $T3(a,b,c)=(0.3,0.34,0.36)$ $T4(a,b,c)=(0.64,0,0.36)$

It is preferable from the viewpoint of reliability of the repeating operation that the layer thickness of the high-resistivity layer 4 is large. It is advantageous from the viewpoint of low-voltage operation that the layer thickness of the high-resistivity layer 4 is small. In the embodiment, the layer thickness is set to be constant (1.2 nm) at a time point before plasma oxidation. However, under conditions that the number of repeating operation times is $10^6$ or larger and the write voltage is 1.8V or less, the operation was confirmed in the range of 0.6 to 2.0 nm.

In addition, in the foregoing examples, Te, Al, Cu, and Zr are contained as the constituent elements of the high-resistivity layer 4. Also with a combination of other elements, the number of repeating operation times and the low-voltage operation characteristic are simultaneously satisfied. For example, a result of the case of adding Ge to the elements and Al, Ge+Te, and Cu+Zr are combined at an arbitrary composition ratio is shown in Table 1. Two columns from the right side show the ratios of Cu and Zr in Cu+Zr.

TABLE 1

| | | Composition ratio (atomic %) | | | |
|---|---|---|---|---|---|
| | | Al | Te | CuZr | Cu | Zr |
| The number of repeating times | ≥$10^6$ times | 70.0 | 30.0 | 0.0 | 0.0 | 0.0 |
| | | 67.0 | 33.0 | 0.0 | 0.0 | 0.0 |
| | | 60.0 | 40.0 | 0.0 | 0.0 | 0.0 |
| | | 56.0 | 44.0 | 0.0 | 0.0 | 0.0 |
| | | 30.0 | 70.0 | 0.0 | 0.0 | 0.0 |
| | | 0.0 | 100.0 | 0.0 | 0.0 | 0.0 |
| | | 58.0 | 33.0 | 9.0 | 5.0 | 4.0 |
| | | 50.0 | 40.0 | 10.0 | 10.0 | 0.0 |
| | | 50.0 | 40.0 | 10.0 | 0.0 | 10.0 |
| | | 56.0 | 29.0 | 15.0 | 10.0 | 5.0 |
| | | 55.0 | 29.0 | 16.0 | 6.0 | 10.0 |
| | | 50.0 | 32.0 | 18.0 | 9.0 | 9.0 |
| | | 45.0 | 36.0 | 19.0 | 15.0 | 4.0 |
| | | 45.0 | 36.0 | 19.0 | 4.0 | 15.0 |
| | | 0.0 | 78.0 | 22.0 | 15.0 | 7.0 |
| | | 0.0 | 78.0 | 22.0 | 22.0 | 0.0 |
| | | 30.0 | 44.0 | 26.0 | 13.0 | 13.0 |
| | | 15.0 | 54.0 | 31.0 | 16.0 | 15.0 |
| | | 35.0 | 33.0 | 32.0 | 16.0 | 16.0 |
| | | 0.0 | 64.0 | 36.0 | 20.0 | 16.0 |
| | <$10^6$ times | 0.0 | 36.0 | 64.0 | 32.0 | 32.0 |
| | | 0.0 | 36.0 | 64.0 | 0.0 | 64.0 |
| | | 0.0 | 36.0 | 64.0 | 64.0 | 0.0 |
| | | 82.0 | 0.0 | 18.0 | 0.0 | 18.0 |
| | | 82.0 | 0.0 | 18.0 | 0.0 | 18.0 |
| | | 82.0 | 0.0 | 18.0 | 0.0 | 18.0 |
| | | 69.0 | 0.0 | 31.0 | 0.0 | 31.0 |
| | | 63.0 | 0.0 | 37.0 | 0.0 | 37.0 |

From Table 1, it is understood that when 30≤Te≤100 atomic %, Al≤70 atomic %, and Cu, Zr≤36 atomic %, the compositions other than the composition of the embodiment also satisfy the number of repeating operation times ($10^6$ times or more) and the reference of the low-voltage operation characteristic (1.8V or less).

The memory element of the present embodiment has been described above by the embodiment and the examples. In the memory element 10 of the embodiment, the bottom electrode 3, the high-resistivity layer 4, the ion source layer 5, and the top electrode 6 are disposed in this order. Alternatively, they may be disposed in order of the bottom electrode 3, the ion source layer 5, the high-resistivity layer 4, and the top electrode 6.

In the memory element 10 of the embodiment, the ion source layer 5 and the top electrode 6 are formed of different materials. It is also possible to make the electrode contain elements which become an ion source (Cu, Ag, and Zn) to serve as both of the electrode layer and the ion source layer.

Further, although the present embodiment is realized by making the high-resistivity layer 4 of a Te oxide having a moderately low melting point, an Sb (antimony) oxide having a melting point of the same degree may be used in place of the Te oxide.

In addition, Cu and Zr are used as addition elements other than Te and Al for the high-resistive layer 4. However, metal elements which are less easily oxidized than Al, for example, Ti, Mn, V, Zn, Ga, Fe, In, Co, Ni, Mo, Sn, Ge, Rh, Ag, Pd, Pt, Au, or the like may be added. Moreover, W, Re, and Ru having conductivity also after oxidation may be also added.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A memory element comprising, between first and second electrodes:
a high-resistivity layer made of an oxide containing at least Te; and
an ion source layer containing at least one kind of metal element and at least one kind of a chalcogen element selected from Te, S, and Se, wherein Te, Al, and Cu+Zr are contained in the high-resistivity layer in a range in which 30≤Te≤100 atomic %, 0≤Al≤70 atomic %, and 0≤Cu+Zr≤36 atomic % are satisfied.

2. The memory element according to claim 1, wherein a resistance value decreases when a current path containing the metal element is formed in the high-resistivity layer or a number of defects are formed by the metal element by application of voltage to the first and second electrodes.

3. The memory element according to claim 1, wherein the high-resistivity layer contains Al.

4. The memory element according to claim 1, wherein the metal element is at least one kind of Cu, Ag, and Zn.

5. A memory element comprising, between first and second electrodes:
a high-resistivity layer made of an oxide containing at least Te; and
an ion source layer containing at least one kind of metal element and at least one kind of a chalcogen element selected from Te, S, and Se, wherein in the high-resistivity layer, a composition ratio of Te, Al, and Cu+Zr (atomic % ratio, excluding oxygen) has a value within a range connecting points T1, T2, T3, and T4 shown in formula 1 where Te is expressed as "a", Al is expressed as "b", and Cu+Zr is expressed as "c" in a ternary diagram using Te, Al, and Cu+Zr as vertexes:

$T1(a,b,c)=(1,0,0)$ $T2(a,b,c)=(0.3,0.7,0)$ $T3(a,b,c)=(0.3,0.34,0.36)$ $T4(a,b,c)=(0.64,0,0.36)$ (formula 1).

6. The memory device according to claim 5, wherein a resistance value decreases when a current path containing the metal element is formed in the high-resistivity layer or a number of defects are formed by the metal element by application of voltage to the first and second electrodes.

7. The memory element according to claim 5, wherein the high-resistivity layer contains Al.

8. The memory element according to claim 5, wherein the metal element is at least one kind of Cu, Ag, and Zn.

9. A memory device comprising:
a memory element having, between first and second electrodes, an ion source layer and a high-resistivity layer;
a first wiring electrically connected to the first electrode;
a second wiring electrically connected to the second electrode; and
a switching element inserted in series in the first wiring and controlling voltage applied across the first and second electrodes,
wherein the high-resistivity layer constituting the memory element is made of an oxide containing Te, and
the ion source layer contains at least one kind of metal elements and at least one kind of chalcogen elements of Te, S, and Se, wherein Te, Al, and Cu+Zr are contained in the high-resistivity layer in a range in which 30≤Te≤100 atomic %, 0≤Al≤70 atomic %, and 0≤Cu+Zr≤36 atomic % are satisfied.

10. The memory device according to claim 9, wherein a resistance value decreases when a current path containing at least one kind of the metal elements is formed in the high-resistivity layer or a number of defects are formed by at least one kind of the metal elements by application of voltage to the first and second electrodes.

11. The memory device according to claim 9, wherein the high-resistivity layer contains Al.

12. The memory device according to claim 9, wherein at least one kind of the metal elements is at least one kind of Cu, Ag, and Zn.

13. A memory device comprising:
a memory element having, between first and second electrodes, an ion source layer and a high-resistivity layer;
a first wiring electrically connected to the first electrode;
a second wiring electrically connected to the second electrode; and
a switching element inserted in series in the first wiring and controlling voltage applied across the first and second electrodes,
wherein the high-resistivity layer constituting the memory element is made of an oxide containing Te, and
the ion source layer contains at least one kind of metal elements and at least one kind of chalcogen elements of Te, S, and Se, wherein in the high-resistivity layer, a composition ratio of Te, Al, and Cu+Zr (atomic % ratio, excluding oxygen) has a value within a range connecting points T1, T2, T3, and T4 shown in formula 1 where Te is expressed as "a", Al is expressed as "b", and Cu+Zr is expressed as "c" in a ternary diagram using Te, Al, and Cu+Zr as vertexes:

$$T1(a,b,c)=(1,0,0)$$
$$T2(a,b,c)=(0.3,0.7,0)$$
$$T3(a,b,c)=(0.3,0.34,0.36)$$
$$T4(a,b,c)=(0.64,0,0.36) \quad \text{(formula 1)}.$$

14. The memory device according to claim 13, wherein a resistance value decreases when a current path containing at least one kind of the metal elements is formed in the high-resistivity layer or a number of defects are formed by at least one kind of the metal elements by application of voltage to the first and second electrodes.

15. The memory device according to claim 13, wherein the high-resistivity layer contains Al.

16. The memory device according to claim 13, wherein at least one kind of the metal elements is at least one kind of Cu, Ag, and Zn.

* * * * *